(12) United States Patent
Izawa et al.

(10) Patent No.: US 6,727,421 B2
(45) Date of Patent: Apr. 27, 2004

(54) REPRODUCING APPARATUS

(75) Inventors: Hidehito Izawa, Hanno (JP); Shigeo Morimoto, Kodaira (JP); Masanori Watanuki, Hamura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 448 days.

(21) Appl. No.: 09/761,695

(22) Filed: Jan. 18, 2001

(65) Prior Publication Data

US 2001/0013983 A1 Aug. 16, 2001

(30) Foreign Application Priority Data

Jan. 21, 2000 (JP) ........................................ 2000-013237

(51) Int. Cl.⁷ ................................................ A62H 5/00
(52) U.S. Cl. .......................................... 84/609; 84/649
(58) Field of Search ........................... 84/609, 649, 634

(56) References Cited

U.S. PATENT DOCUMENTS 5,239,124 A * 8/1993 Eitaki et al. ................... 84/634
5,386,081 A * 1/1995 Nakada et al. ................. 84/609
5,557,541 A   9/1996 Schulhof et al. ............... 700/94

* cited by examiner

Primary Examiner—David Hudspeth
Assistant Examiner—Dan I Davidson
(74) Attorney, Agent, or Firm—Finnegan, Henderson, Farabow, Garrett & Dunner, L.L.P.

(57) ABSTRACT

In a reproducing apparatus for reproducing audio data, a central control section includes detection means for detecting playlists of plural kinds of formats, and detection means for detecting audio data not associated with playlists. The central control section reads out audio data from an audio data storage section, and discriminating the format of the audio data to detect playlists. In addition, the central control section detects the presence/absence of audio data not associated with playlists, and if audio data not associated with playlists is stored, processes a list of such audio data as one playlist. The central control section causes the detected playlists to be displayed on a display section, successively processes the audio data from a first one of the playlists, and outputs the processed data through a sound output section.

4 Claims, 12 Drawing Sheets

| X:PLAYLIST NUMBER OF FORMAT A |
| Y:PLAYLIST NUMBER OF FORMAT B |
| Z:PLAYLIST NUMBER OF RAW AUDIO FILE |

REPRODUCING APPARATUS

CROSS-REFERENCE TO RELATED APPLICATIONS

This application is based upon and claims the benefit of priority from the prior Japanese Patent Application No. 2000-013237, filed Jan. 21, 2000, the entire contents of which are incorporated herein by reference.

BACKGROUND OF THE INVENTION

The present invention relates generally to a reproducing apparatus for reproducing digital audio/video data, and more particularly to a reproducing apparatus having a playlist processing function matching with reproduction orders on playlists of plural kinds of formats.

Recently, many types of players capable of recording digital audio data have been marketed. In one type, audio data alone is recorded. In another, data called a playlist in which an order of play is described is recorded and reproduction is performed according to a reproduction order on the playlist.

For reproduction of audio data, the player, in general, has a return function for returning a current position of play. Where the same data range is to be played twice or more, a return operation needs to be performed each time. In this case, the final position of return varies from user to user, since the user refers to a value of a counter, etc. A desired data range is not always played each time. In order to solve this problem, an "AB repeat" function is proposed. According to this function, a data range to be played is designated and reproduced repeatedly.

In the prior art, removable media storing audio data produced for one player cannot, in some cases, be reproduced by another player. The reason is that an expected playlist is not present in the removable media or a playlist format is different. In such cases, the user has to prepare a new playlist. Even if the removable media are reproduced, the order of reproduction may differ from that expected.

As regards the AB repeat function provided in the conventional player, a data range to be played needs to be designated. Since the designation is performed after the user has thought of "once more play", the number of operational procedures increases. Thus, the operation becomes very time-consuming and complex.

Besides, in general, a small portable player uses a battery alone as an operational power supply. Thus, the power of the battery is shortly consumed. That is, the lifetime of the battery is short.

BRIEF SUMMARY OF THE INVENTION

The present invention has been made in order to solve the above problems, and an object of the invention is to provide a reproducing apparatus which permits a removable medium storing audio data or video data to be reproduced by some other player in an expected play order, without preparing a new playlist.

Another object of the invention is to provide a reproducing apparatus capable of automatically memorizing a final return position and starting reproduction from the memorized position by one-touch control.

Still another object of the invention is to provide a reproducing apparatus capable of reducing consumption of power of the battery and increasing the lifetime of a battery, where a reproducing operation is performed in the state in which the apparatus is connected to a host device, by utilizing power from the host device.

According to a first aspect of the invention, there is provided a reproducing apparatus comprising:
  playlist detection means for reading out digital data on plural kinds of formats compressed and stored in a memory medium and detecting a plurality of playlists of the read-out digital data; and
  reproduction means for reproducing the digital data of the playlists detected by the playlist detection means.

Since this apparatus includes the means for detecting the playlists of the plural kinds of formats, even if the memory medium contains playlists of different formats, the data can be reproduced according to the playlists.

According to a second aspect of the invention, in the reproducing apparatus according to the first aspect, the reproduction means reproduces the digital data of each of the plurality of playlists detected by the playlist detection means successively from a first one of the playlists.

With this structure, even if the memory medium contains playlists of plural kinds of formats, the playlists can be discriminated and successively reproduced.

According to a third aspect of the invention, in the reproducing apparatus according to the first aspect, the playlist detection means includes means for detecting data, which is unassociated with playlists, and detects the data unassociated with playlists as one playlist.

When data not associated with playlists is detected, a list of the data is processed as one playlist. Thus, data formed for reproducing apparatuses with no playlists can be reproduced.

According to a fourth aspect of the invention, in the reproducing apparatus according to the first aspect, the playlist detection means detects playlists stored in a plurality of memory media and displays the detected playlists.

With this structure, even where plural memory media are mounted on the reproducing apparatus, the playlists stored in each record medium are successively detected and displayed. Thus, the user can select and reproduce a desired one of the successively displayed playlists, without paying attention to the plural memory media or memory devices.

According to a fifth aspect of the invention, in the reproducing apparatus according to the first aspect, the playlist detection means sets an order of priority on the formats of the detected playlists, and the reproduction means reproduces the digital data of the playlists in the order of the set priority on the formats of the playlists.

With this structure, the order of priority on the formats of playlists for reproduction can be set, and the playlists can be efficiently selected according to the user's preference.

According to a sixth aspect of the invention, the reproducing apparatus according to the first aspect further comprises select means for selecting a desired one of the playlists detected by the playlist detection means, wherein the reproduction means reproduces the digital data of the playlist selected by the select means.

Since this apparatus includes the playlist select means for selecting a desired one of the playlists detected by the playlist detection means, even if the memory medium contains playlists of different formats, a desired playlist can be selected for the reproduction operation.

According to a seventh aspect of the invention, there is provided a reproducing apparatus comprising:
  reproduction means for reading out and reproducing data stored in a memory medium;
  return means for returning a position of start of reproduction;

final return position storing means for storing a position to which the position of start of reproduction is finally returned by the return means;

return instruct means for instructing a repeat reproduction operation; and repeat reproduction means for reading out the final return position from the final return position storing means when a return instruction is issued from the return instruct means, and starting the repeat reproduction operation from the final return position.

The final return position is stored in the final return position storing means. Thus, when repeat reproduction of the same audio data is desired, if the return operation is once performed, reproduction can be exactly performed from the desired point in the following operations only by instructing the return operation.

According to an eighth aspect of the invention, there is provided a reproducing apparatus comprising:

reproduction means for reading out and reproducing data stored in a memory medium;

fast-forwarded means for fast-advancing a position of start of reproduction;

final forwarded position storing means for storing a position to which the position of start of reproduction is finally forwarded by the fast-forwarded means;

return instruct means for instructing a repeat reproduction operation; and repeat reproduction means for reading out the final forwarded position from the final forwarded position storing means when a return instruction is issued from the return instruct means, and starting the repeat reproduction operation from the final forwarded position.

When fast forwarded is performed, the final forwarded position is stored in the final forwarded position storing means. Thus, if the current position of play is excessively returned beyond the desired point in the first return operation, the position of play is adjusted by the fast forwarded. In this case, too, play can be exactly performed from the desired point by the return instruction.

According to a ninth aspect of the invention, there is provided a reproducing apparatus comprising:

reproduction means for reading out and reproducing data stored in a memory medium;

return means for returning a position of start of reproduction;

return instruct means for instructing return by the return means;

final return position storing means for storing a final return position to which the position of start of reproduction is finally returned by the return means;

skip instruct means for instructing a skip of a track of the data;

first determination means for determining, when the skip has been instructed by the skip instruct means, whether a current position of reproduction is at a beginning of the track or not;

second determination means for determining a relationship among the final return position stored in the final return position storing means, the current position of reproduction, and the track; and position-of-reproduction determining means for determining a position of reproduction on the basis of determination results of the first determination means and the second determination means.

In the reproducing apparatus with the track skip function, when the skip has been instructed by the skip instruct means, it is determined whether a current position of reproduction is at a beginning of the track or not. In addition, a relationship among the final return position stored in the final return position storing means, the current position of reproduction, and the track is determined. A position of reproduction is determined on the basis of the determination results. Thus, where the number of operation keys is small, even if the return instruct means is not provided, it should suffice if the return operation is once performed. In the next operations, play can be exactly performed from the beginning of the track or the desired point only by instructing the skip operation.

According to a tenth aspect of the invention, there is provided a reproducing apparatus comprising:

reproduction means for reading out and reproducing data stored in a memory medium;

return means for returning a position of start of reproduction;

final return position storing means for storing a final return position to which the position of start of reproduction is finally returned by the return means;

skip instruct means for instructing a skip of a track of the data;

position determination means for determining, when the skip has been instructed by the skip instruct means, whether the final return position stored in the final return position storing means is before or after a current position of reproduction in the track which is being reproduced; and repeat reproduction means for starting reproduction from the final return position when the position determination means has determined that the final return position is before the current position of reproduction, and for starting reproduction from a beginning point of the currently reproduced track when the position determination means has determined that the final return position is after the current position of reproduction.

According to an eleventh aspect of the invention, there is provided a reproducing apparatus comprising:

reproduction means for reading out and reproducing data stored in a memory medium;

return means for returning a position of start of reproduction;

final return position storing means for storing a final return position to which the position of start of reproduction is finally returned by the return means;

skip instruct means for instructing a skip of a track of the data;

position determination means for determining, when the skip has been instructed by the skip instruct means and a current position of reproduction is at a beginning of the track, whether the final return position stored in the final return position storing means is before or after the current position of reproduction; and repeat reproduction means for starting reproduction from the final return position when the position determination means has determined that the final return position is in a previous track preceding the track in which the current position of reproduction is present, and for starting reproduction from a beginning point of the previous track when the position determination means has determined that the final return position is absent in the previous track preceding the track in which the current position of reproduction is present.

With this structure, when the host device is connected to the reproducing apparatus, the power from the host device is utilized. Thus, the power consumption in the battery of the reproducing apparatus is reduced, and the lifetime of the battery is increased.

According to a twelfth aspect of the invention, the reproducing apparatus according to the eleventh aspect further comprises setting means for effecting setting as to whether a determination process by the position determination means is effective or not, wherein if the setting means has effected setting such that the determination process by the position determination means is not effective, the determination process by the position determination means is not performed.

Since there is provided the means for effecting setting as to whether the determination process based on the final return position stored in the final return position storing means is effective or not, the skip instruct function can be selectively used according to the condition of reproduction and the skip process can be performed efficiently.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described with reference to the accompanying drawings.

Figure 1A:
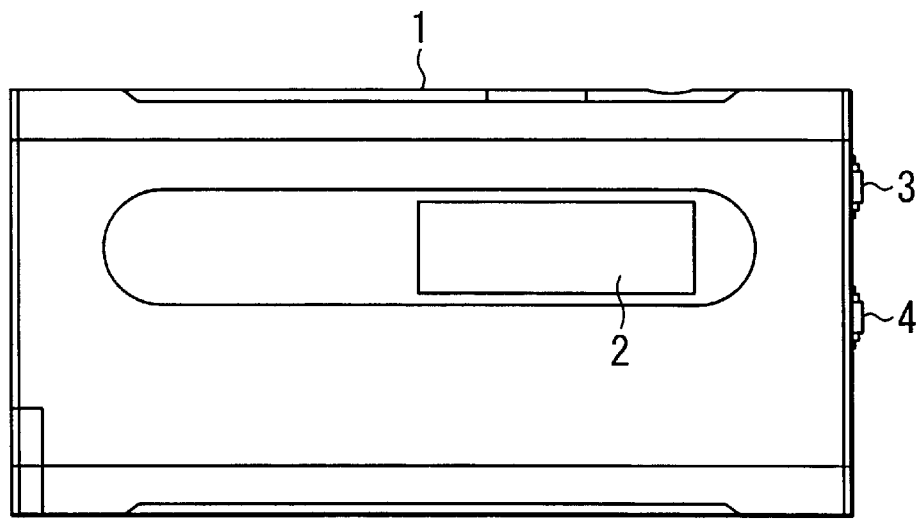
FIG. 1A is a front view of a reproducing apparatus according to an embodiment of the present invention.
Figure 1B:
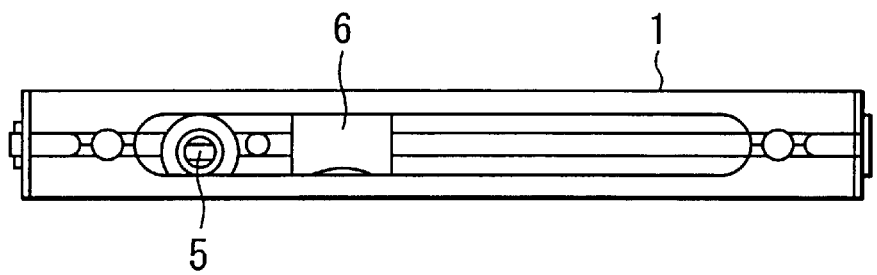
FIG. 1B is a top view of the reproducing apparatus according to the embodiment of the invention.
Figure 1C:
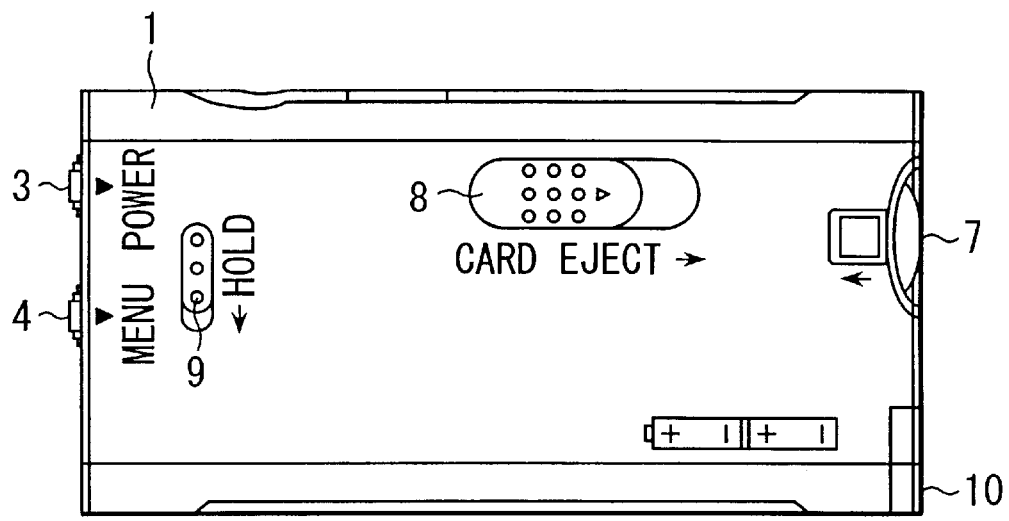
FIG. 1C is a rear view of the reproducing apparatus according to the embodiment of the invention.

FIGS. 1A to 1C show the external structure of the present invention applied to a digital audio reproducing apparatus. FIG. 1A is a front view, FIG. 1B is a top view and FIG. 1C is a rear view. As is shown in FIG. 1, a display section 2 such as a liquid crystal display is provided on a front surface of a case 1. A first jog switch (POWER) 3 and a second jog switch (MENU) 4 are provided on one side surface of the case 1. The first jog switch 3 is depressed and vertically rotated to effect power on/off, pause, start-point search, and fast-forward/fast-return. The second jog switch 4 is depressed and vertically rotated to effect volume control and mode selection.

A headphone jack 5 and an I/F terminal 6 are provided on a top surface of the case 1. The I/F terminal 6 is used when the apparatus is connected to an external host device such as a personal computer (not shown). In the normal state, the I/F terminal 6 is protected by a cover. An example of the I/F terminal 6 is an interface such as a USB (universal serial bus) having a function of supplying power from a personal computer when the apparatus is connected to the PC.

As is shown in FIG. 1C, a card insertion opening 7 for insertion of, e.g. a memory card, is provided at the other side surface of the case 1. The card insertion opening 7 comprises one or two slots for memory cards such as start-media. Audio data is recorded on the memory card in a compressed format according to, e.g. an MP3 audio format, that is, MPEG1 Layer III audio format. In addition, a card eject switch 8, a hold switch 9 and a battery cover 10 are provided on a rear surface of the case 1. Characters "POWER" are indicated at a position corresponding to the first jog switch 3, and characters "MENU" are indicated at a position corresponding to the second jog switch 4. The card eject switch 8 is a slide switch and is operated when the memory card is to be removed from the card insertion opening 7. If the hold switch 9 is slid down, as indicated by the arrow, the operations of the jog switches 3 and 4 cannot be effected and malfunction due to unintentional contact can be prevented.

Figure 2:
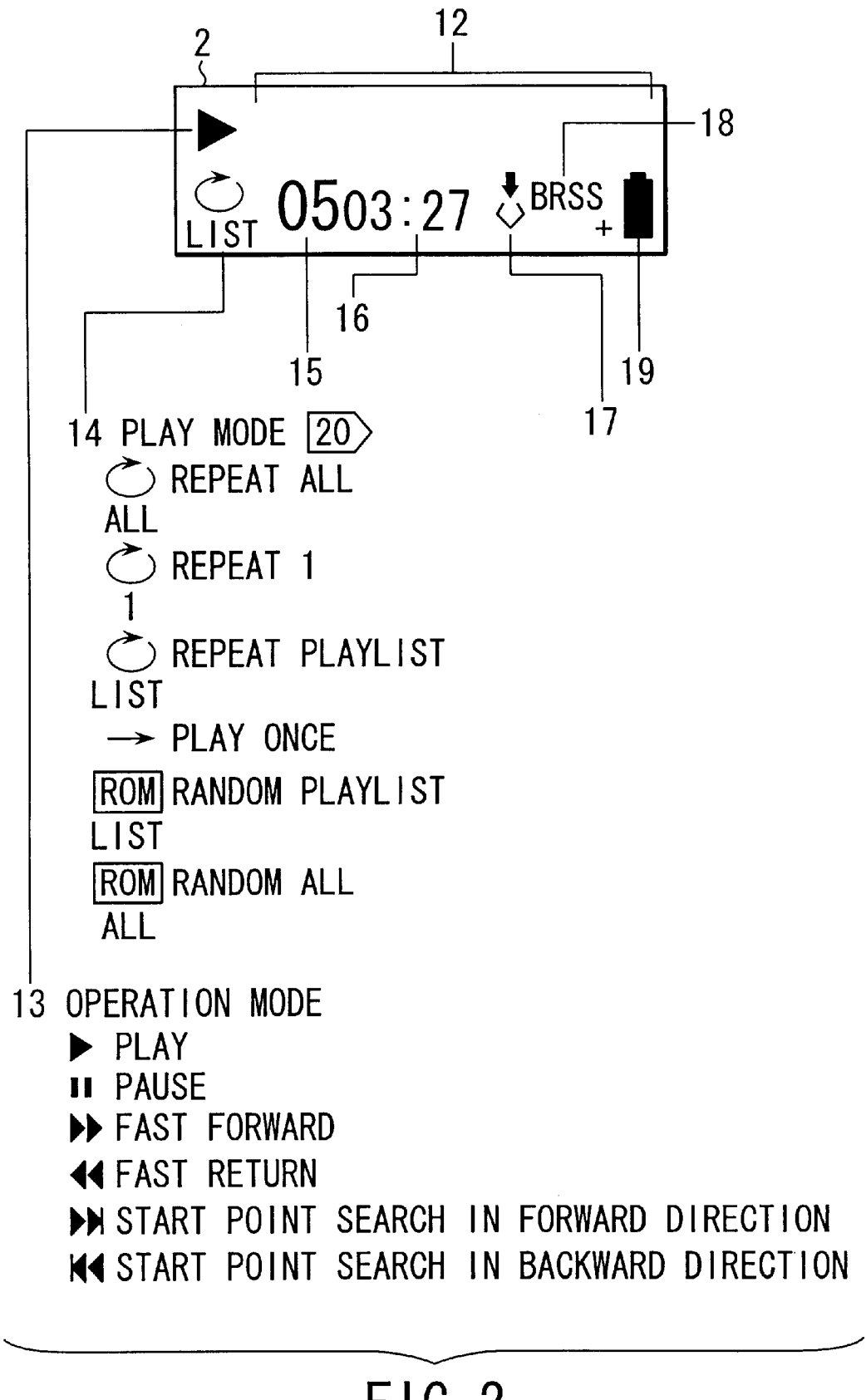
FIG. 2 shows an example of display on a display section in the embodiment.

FIG. 2 shows an example of display on the display section 2. In FIG. 2, reference numeral 12 denotes a title/level meter display area, and the display content is chosen by the setting of a play screen mode. In addition, the display section 2 displays an operation state 13, a play mode 14, a tune number 15, a current music play time 16, a quick return mode 17, a play tone mode 18, and a battery residual capacity indicator 19.

In the title/level meter display area 12, if the play screen mode is set at "TITLE", the titles of tunes, etc. are scrolled.

If the play screen mode is set at "LEVEL", the volume levels of right (R) and left (L) are graphically displayed.

For the display of the operation state 13, symbols indicating "play", "pause", "fast forward", "fast return", "start point search in forward direction" and "start point search in backward direction" are successively displayed according to the operation of the first jog switch 3.

The play mode 14 is chosen among "REPEAT ALL", "REPEAT 1", "REPEAT PlayList", "PLAY ONCE", "RANDOM PlayList" and "RANDOM ALL". In "REPEAT ALL", reproduction is repeated in the order of a built-in memory and a memory card. In "REPEAT 1", one tune is repeated. In "REPEAT PlayList", all tunes on a selected playlist are repeated in the order of tunes. In "PLAY ONCE", all tunes in the built-in memory and memory card are once played in the order of the built-in memory and memory card. In "RANDOM PlayList", all tunes on a selected playlist are played at random. In "RANDOM ALL", all tunes in the built-in memory and memory card are played at random.

In the quick return mode 17, a start point of a portion to be repeatedly played is memorized. If the first jog switch 3 is moved upward, the memorized start point is found. This function is performed by displaying "ON".

Figure 3:
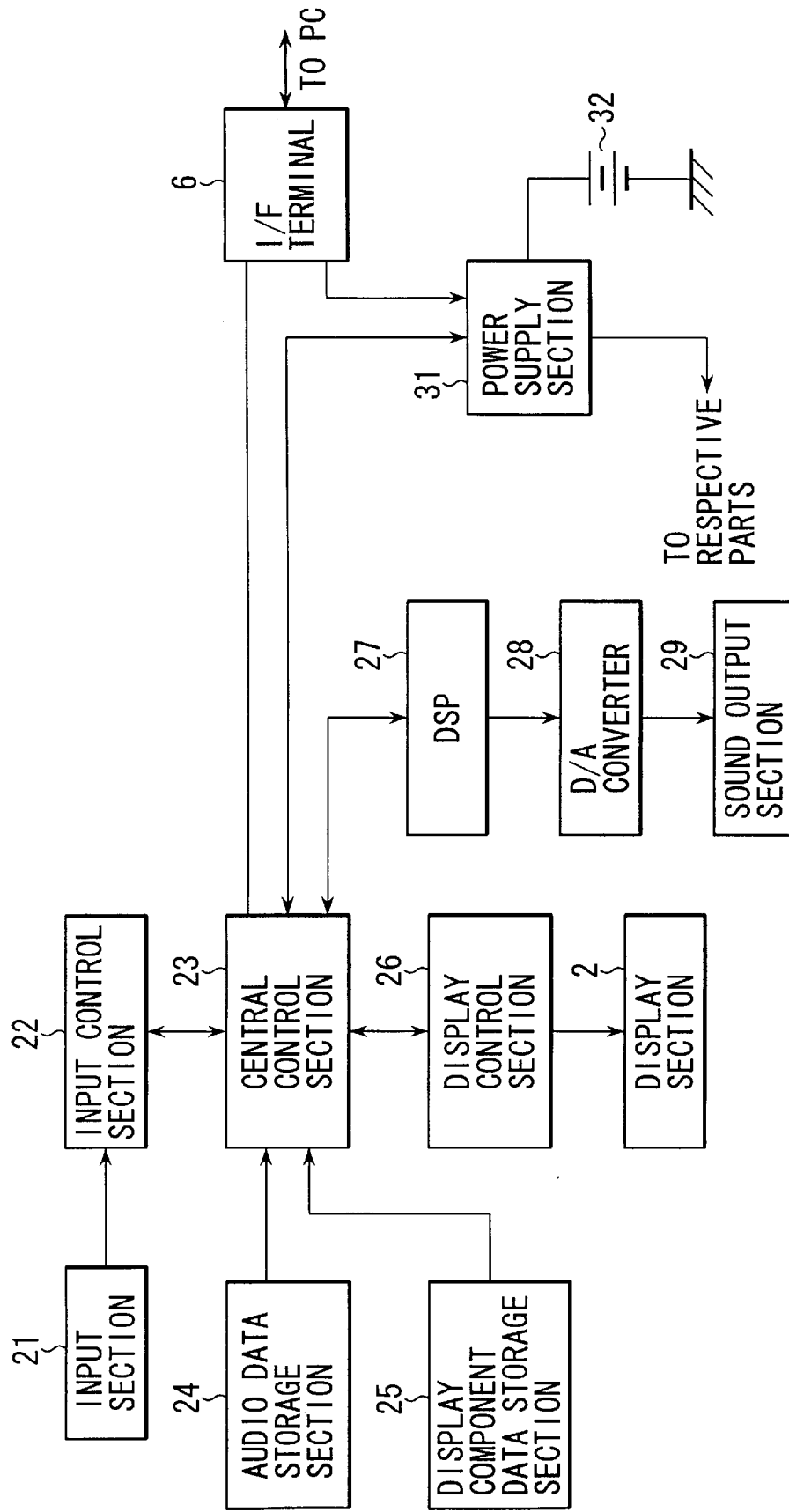
FIG. 3 is a block diagram showing in detail a circuit configuration in the embodiment.

A circuit configuration of the audio reproducing apparatus in the case 1 will now be described with reference to FIG. 3. In FIG. 3, reference numeral 21 denotes an input section such as the first jog switch 3, second jog switch 4 and hold switch 9. Data input by a switch operation or a key operation in the input section 21 is delivered to an input control section 22. The input control section 22 interprets the input data and processes the data according to a request from a central control section 23 such as a microcomputer. The input control section 22 delivers the processed data to the central control section 23. An audio data storage section 24 and a display component data storage section 25 are connected to the central control section 23. In addition, the display section 2 is connected to the central control section 23 via a display control section 26.

The audio data storage section 24 is a slot for semiconductor removable media such as smart-media. Compressed digital audio data or playlists are stored in the removable media in the form of files. The display component data storage section 25 comprises, e.g. a ROM and stores various display part data. The central control section 23 performs data processing by referring to the display component data storage section 25 according to input operations, etc., and delivers the processed data to the display control section 26. Thus, the operation state such as "PLAY" and the playlist name are displayed on the display section 2. Specifically, the central control section 23 has a function of interpreting playlists associated with plural audio formats. The central control section 23 discriminates the audio format stored in the audio data storage section 24, interprets the playlist name of the discriminated audio format, and enables the display section 2 to display it.

Moreover, a digital signal processor (DSP) 27 is connected to the central control section 23. The digital signal processor 27 decompresses compressed digital audio data and delivers it to a D/A converter 28. The D/A converter 28 converts the digital audio data output from the digital signal processor 27 to reproducible analog data and delivers it to a sound output section 29. The sound output section 29 outputs sound by means of a sound amplifier and a speaker or a headphone.

The central control section 23 is connected to a host device such as a personal computer via the I/F terminal 6, where necessary. The I/F terminal 6 is further connected to a power supply section 31. Specifically, where the personal computer is connected to the I/F terminal 6, power from the PC is supplied to the power supply section 31 via the I/F terminal 6. In the normal state, the power supply section 31 supplies operational power from a battery 32 to the respective circuit components. However, if the PC is connected, the power supply section 31 utilizes power from the PC and saves the power consumption in the battery 32. In this case, if the PC is connected, the central control section 23 inquires of the PC side whether the supply of power is possible. Based on the result of inquiry, the central control section 23 controls the operation of the power supply section 31. The power supply section 31 operates according to a control instruction from the central control section 23 and supplies operational power to the respective circuit components using the power from the PC or the battery 32.

Figure 4:
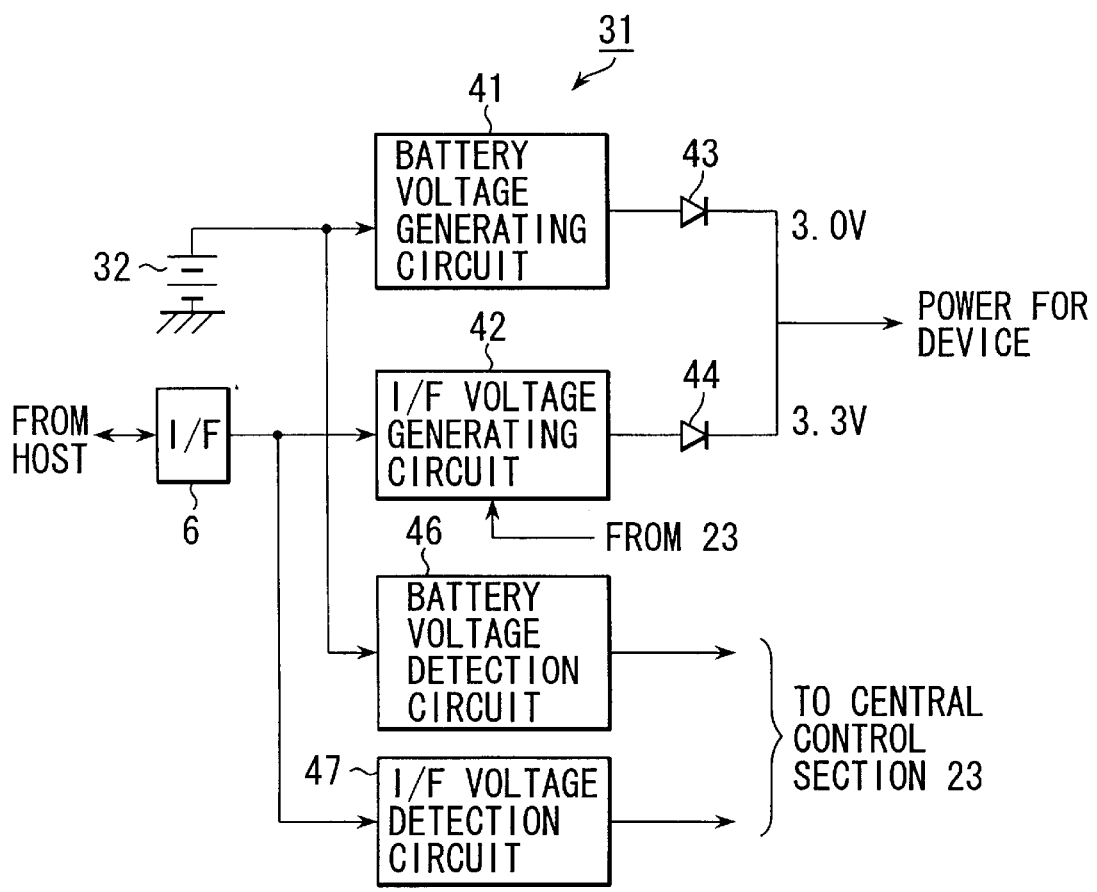
FIG. 4 is a block diagram showing in detail a power supply section in FIG. 3.

FIG. 4 is a block diagram showing the circuit configuration of the power supply section 31. In FIG. 4, reference numeral 41 denotes a voltage generating circuit for generating a voltage of, e.g. 3.0V, on the basis of the voltage of the battery 32. Numeral 42 denotes a voltage generating circuit for generating a voltage of, e.g. 3.3V, which is slightly higher than the voltage generated by the voltage generating circuit 41, on the basis of the voltage supplied from the PC via the I/F terminal 6. The voltage generating circuit 42 operates according to a control instruction from the central control section 23.

The voltage of 3.0V generated by the voltage generating circuit 41 is taken out via a diode 43, and the voltage of 3.3V generated by the voltage generating circuit 42 is taken out via a diode 44. The voltages taken out via the diodes 43 and 44 are supplied to the respective circuit components via a common power line 45. In the state in which the PC is not connected, the voltage of 3.0V generated by the voltage generating circuit 41 is output to the power line 45 via the diode 43. In the state in which the PC is connected and power from the PC can be utilized, the voltage of 3.3V is generated by the voltage generating circuit 42 and output to the power line 45 via the diode 44. Since the voltage generated by the voltage generating circuit 42 is slightly higher than that generated by the voltage generating circuit 41, a reverse bias is applied to the diode 43 and the diode 43 is set in the non-conductive state. Accordingly, where the power from the PC can be used, the power from the battery 32 can be stopped and saved.

The diode 43 functions to prevent the battery 32 from being charged with the voltage generated by the voltage generating circuit 42. Where a dry battery is used as the battery 32, it is not charged to prevent leak of liquid. On the other hand, the diode 44 functions to prevent the voltage generated by the voltage generating circuit 41 from being applied to the I/F terminal 6 when the PC is not connected.

An output voltage from the battery 32 is detected by a battery voltage detection circuit 46 and delivered to the central control section 23. On the other hand, a voltage supplied from the PC via the I/F terminal 6 is detected by an I/F voltage detection circuit 47 and delivered to the central control section 23. Based on the detection signal from the battery voltage detection circuit 46, the central control section 23 enables display of a battery residual capacity. If the battery residual capacity is small, the central control section 23 prohibits access to, e.g. a flash memory storing programs. In addition, based on the detection signal from the I/F voltage detection circuit 47 and a result of communication with the PC, the central control section 23 controls the operation of the voltage generating circuit 42.

[Reproducing Process]

A description will now be given of a processing operation in a case where digital audio data recorded on a memory medium such as a memory card is reproduced. If the memory card is inserted into the card insertion opening 7 of case 1, power is automatically turned on and the central control section 23 executes a reproducing process. Like the memory card, a reproducing process for audio data sent from the PC via the I/F terminal 6 can be executed by performing reproducing operations.

Figure 5:
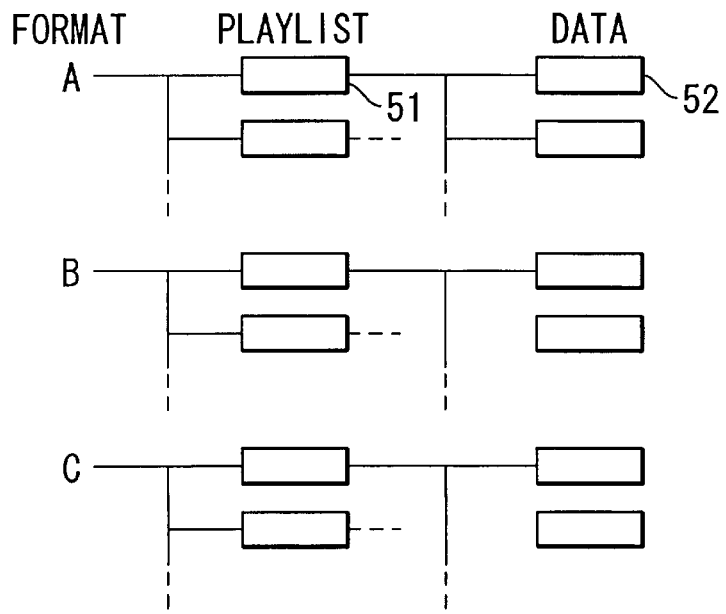
FIG. 5 shows a relationship among a format, a playlist, and data of an audio file stored in a memory in the embodiment.

A playlist process will now be described in a case where audio formats A and B and an audio file C not belonging to audio formats, as shown in FIG. 5, are to be reproduced. In the example shown in FIG. 5, plural playlists 51 are recorded on each of the audio formats A and B and the audio file C not belonging to audio formats, and plural data units are recorded in association with the playlists 51.

Figure 6:
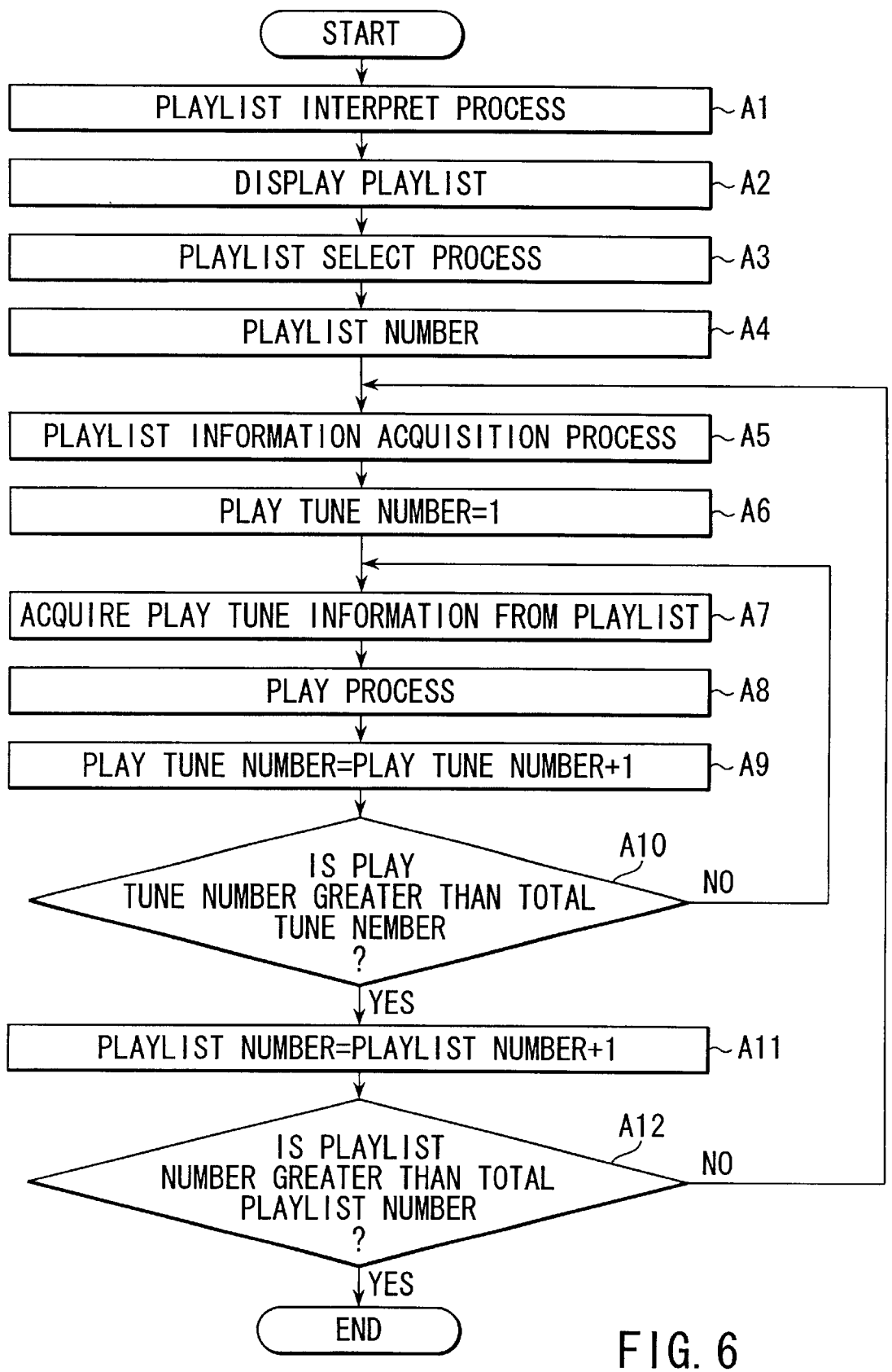
FIG. 6 is a flow chart showing a reproducing process operation in the embodiment.
Figures 7, 8:
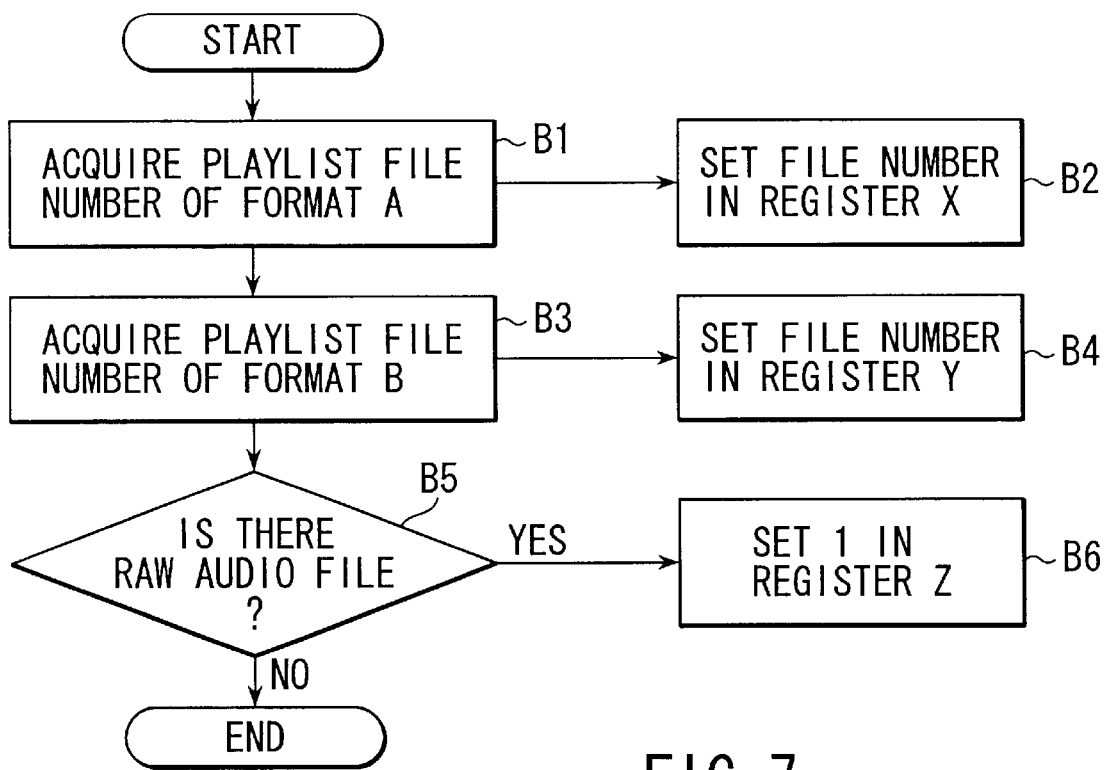
FIG. 7 is a flow chart illustrating in detail a playlist interpretation process in FIG. 6.
FIG. 8 shows a storage state of playlist information in a register in FIG. 7.

The reproducing process is executed according to a flow chart of FIG. 6. A playlist interpret process is executed to interpret playlists recorded on the memory medium (step A1). The names of the interpreted playlists are displayed on the display section (step A2). In the playlist interpret process in step A1, the central control section 23, for example, compares a prestored audio format and an audio format read out from the memory medium and detects the audio format A, as shown in FIG. 7. The number of playlist files of the audio format A is set in an X register (steps B1 and B2). Then, the central control section 23 detects the audio format B and sets the number of playlist files of the audio format B in a Y register (steps B3 and B4). In addition, it is determined whether there is a raw audio file belonging to neither the audio format A nor audio format B (step B5). If there is a raw audio file, "1" is set in a Z register (step B6). If there is no raw audio file, the process is finished.

Figure 10A:
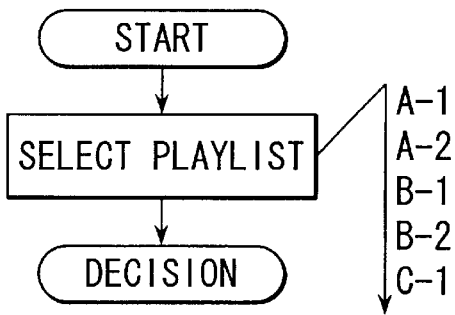
FIGS. 10A and 10B illustrate a playlist select process in the embodiment.

The central control section 23 performs the playlist interpret process, as described above, and displays the first playlist name on the display section 2. If the second jog switch 4 is vertically moved, the playlists A-1 and A-2 of the format A, the playlists B1 and B2 of the format B, and playlist C-1 are successively displayed, as shown in FIG. 10A. If no playlist is recorded and only a MP3 (MPEG1 LayerIII) file is recorded, "MP3-FILE" is displayed. Specifically, if there is audio data which is not associated with playlists, a list of such audio data is processed as one playlist.

Figure 10B:
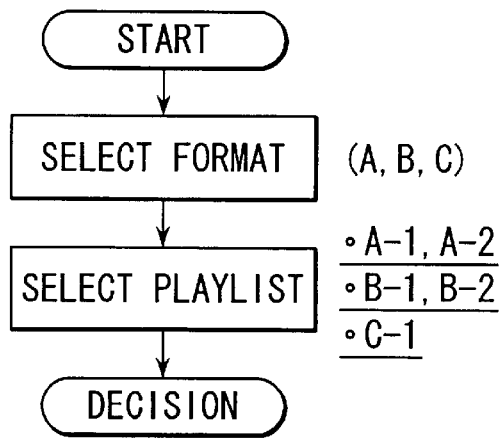

The user makes the display section 2 display a desired playlist by operating the second jog switch 4, and selects the playlist by depressing the first jog switch 3 (step A3). In this case, as shown in FIG. 10B, the formats A, B and C may first be displayed and then the playlists A-1 and A-2 of the selected format, e.g. format A, or the playlists B-1 and B-2 of format B, or the other playlist C-1, may be displayed and selected.

Figure 9:
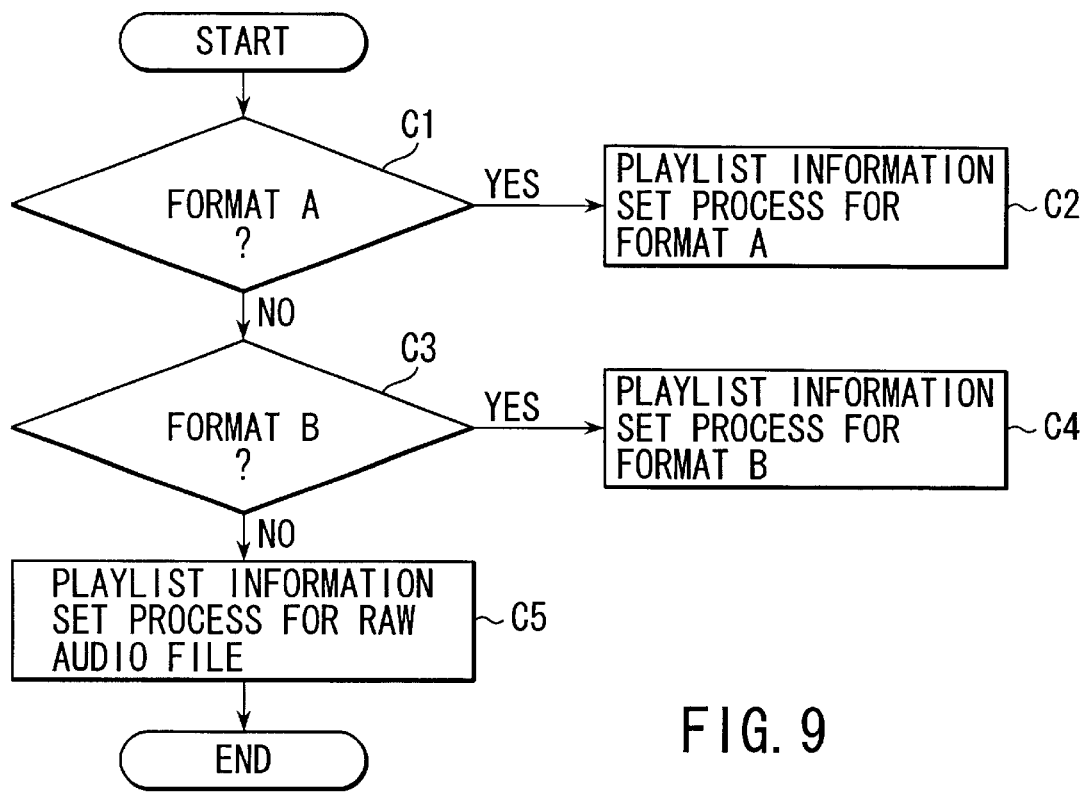
FIG. 9 is a flow chart illustrating in detail a playlist information acquisition process in FIG. 6.

If the playlist has been selected, playlist information on the selected playlist number is acquired (steps A4 and A5). The playlist information acquisition process is executed according to a flow chart of FIG. 9. Specifically, it is determined whether the kind of the selected playlist is the format A (step C1). If it is the format A, the playlist information on the format A is set (step C2) to prepare for the reproducible state.

If the kind of the selected playlist is not the audio format A, control goes to step C3 to determined whether it is the format B (step C3). If the kind of the selected playlist is the format B, the playlist information on the format B is set (step C4) to prepare for the reproducible state. If it is determined in step C3 that the kind of the selected playlist is not the format B, control goes to step C5 and sets the playlist information on the raw audio file, thus preparing for the reproducible state. In this way, the playlist information acquisition process (step A5) is finished.

Subsequently, as shown in the flow chart of FIG. 6, the play tune number is set at 1 (step A6) and tune information on the play tune number 1 is acquired from the selected playlist (step A7). Based on the tune information, the reproducing process is executed (step A8).

After the reproducing process for the play tune number is executed, the play tune number is incremented by "+1" (step A9) and it is determined whether the play tune number is greater than a total tune number T, that is, it is determined whether the reproducing process for 1 playlist is finished (step A10). If the play tune number is not greater than the total tune number T, that is, if the 1 playlist is not finished, control returns to step A7 to acquire tune information associated with the next play tune number from the playlist and to execute the reproducing process.

If it is determined in step A10 that the reproducing process for the 1 playlist has been finished, the playlist number is incremented by "+1" (step A11) and it is determined whether the incremented playlist number is greater than the total playlist number, that is, whether all playlists have been finished (step A12). If all playlists have not been finished, control returns to step A5 to acquire information on the next playlist and to repeat the processing of steps A6 to A12. If it is determined in step A12 that all playlists have been finished, the reproducing process is completed.

As has been described above, according to the present invention, the reproducing apparatus has the function of discriminating the audio format stored in the memory medium and interpreting the playlist of the audio format. Thus, even if the audio format stored in the memory medium is not specified, the playlist of the audio format is interpreted and the tunes are played in a predetermined order. Where the playlist is not recorded, the tunes are played, for example, in an alphabetical file name order or in the order of recording date/time.

The play mode 14 may be freely chosen among "REPEAT ALL", "REPEAT 1", "REPEAT PlayList", "PLAY ONCE", "RANDOM PlayList" and "RANDOM ALL". In "REPEAT ALL", reproduction is repeated in the order of a built-in memory and a memory card. In "REPEAT 1", one tune is repeated. In "REPEAT PlayList", all tunes on a selected playlist are repeated in the order of tunes. In "PLAY ONCE", all tunes in the built-in memory and memory card are once played in the order of the built-in memory and memory card. In "RANDOM PlayList", all tunes on a selected playlist are played at random. In "RANDOM ALL", all tunes in the built-in memory and memory card are played at random.

In a case where there are plural audio memory media, for example, where plural cards are inserted at a time in the reproducing apparatus or plural media such as hard disks are provided on a personal computer when the reproducing apparatus is connected to the PC, the audio data on the respective media may be searched and listed. The obtained list may be stored. The user can select and play a desired tune from the list.

If there are plural kinds of formats of playlists, the order of priority for reproduction may be preset. By setting the priority, the playlist can be efficiently chosen according to the user's preference.

[Quick Return Process]

A description will now be given of a quick return process wherein while audio data is being played, a position of current playing is quickly returned to a designated point. In the quick return process according to this invention, a point to which the position of playing has been returned is automatically stored and playing is started from the stored point by a one-touch operation.

Figure 11:
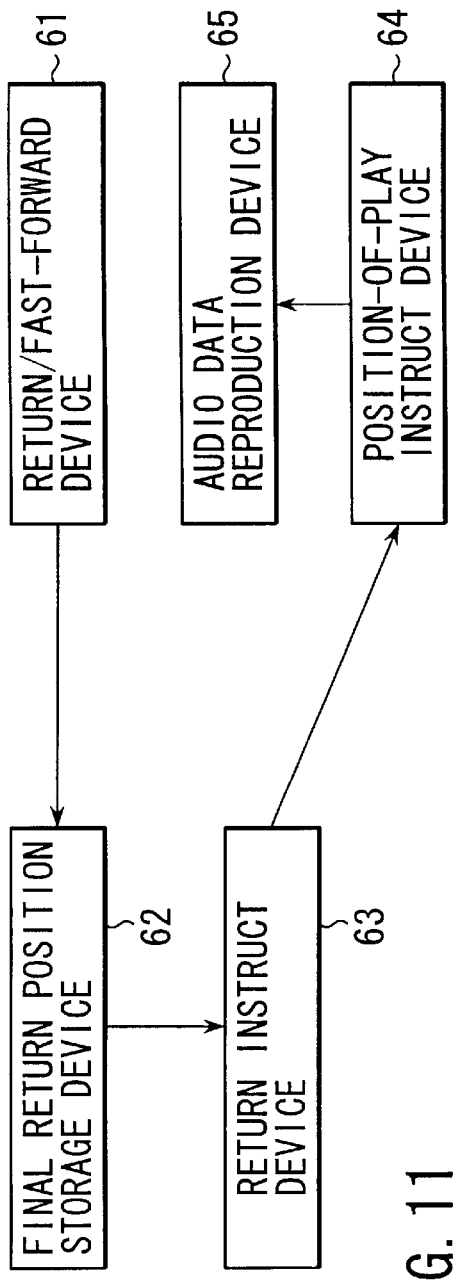
FIG. 11 is a block diagram showing a schematic structure of a quick return process section in the embodiment.
Figure 12:
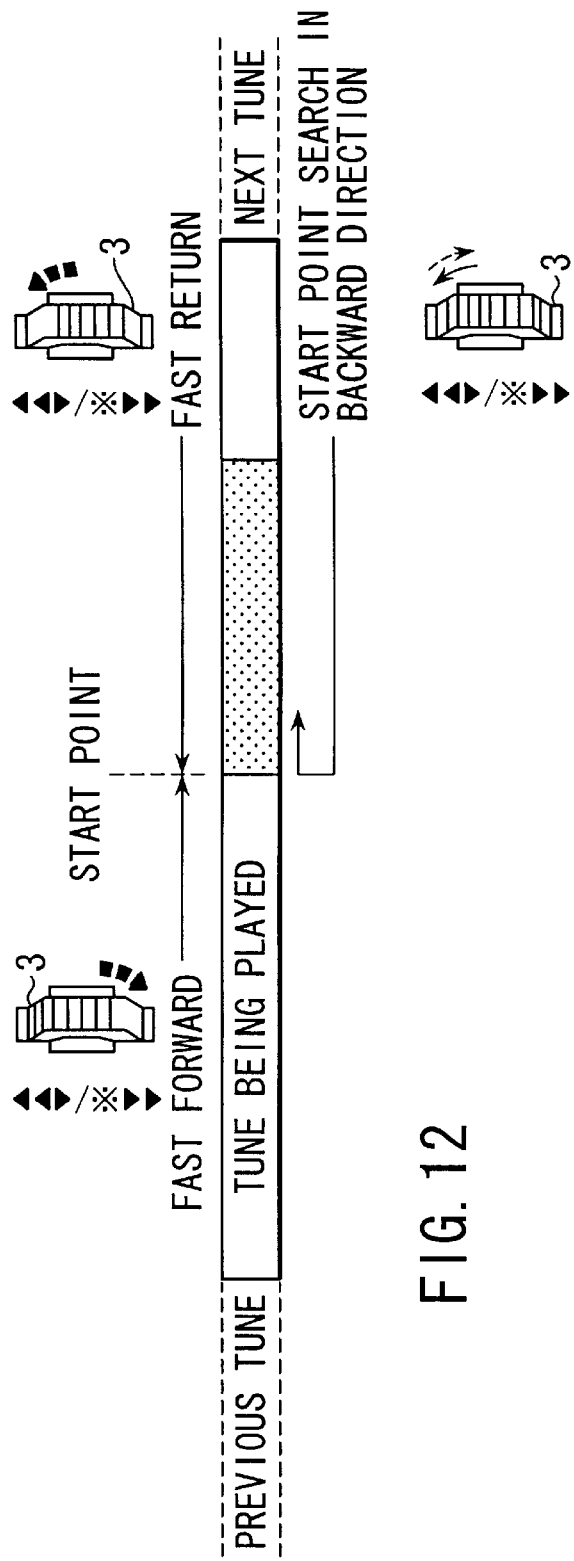
FIG. 12 illustrates a quick return operation in the embodiment.

FIG. 11 is a block diagram schematically showing the structure relating to the quick return process in the reproducing apparatus. In FIG. 11, reference numeral 61 denotes a return/fast-forward device which is activated by vertically moving the first jog switch 3. Specifically, as is shown in FIG. 12, if the first jog switch 3 is moved upward, fast return is effected. If the first jog switch 3 is moved downward, fast forward is effected. A final point to which the position of playing is brought by the return/fast-forward device 61 is stored in a final point storage device 62. The first jog switch 3 is operated to bring the position of playing to a start point of repeat play by fast return or fast forward, and if the first jog switch 3 is released, the start point is stored in the final point storage device 62. The final point storage device 62 is activated when the quick return mode 17 displayed on the display section 2 in FIG. 2 is turned "ON". In this embodiment, data stored in a memory medium such as a memory card is read out and reproduced, the method of playing differs from the case where a magnetic tape is used in a recording/reproducing apparatus. Thus, in this embodiment, a magnetic tape is not actually wound or rewound. However, the general principle of fast forward/return operation is common.

In FIG. 11, reference numeral 63 denotes a return instruct device. When a return operation is effected during playing, for example, when the first jog switch 3 is moved upward, as shown in FIG. 12, the return instruct device 63 reads out the final point stored in the final point storage device 62 and outputs it to a position-of-play instruct device 64. Upon receiving a return instruction from the return instruct device 63, the position-of-play instruct device 64 instructs an audio data reproduction device 65 to start play from the final point stored in the final point storage device 62.

The quick return process operation will now be described. When the quick return function is used, the quick return mode 17 is turned on in advance and the start point for repeat play is stored. Specifically, as shown in FIG. 12, the first jog switch 3 is moved upward during reproduction of a tune or audio data in order to instruct return of the position of current playing. If the point of playing has been returned to a desired point, the first jog switch 3 is released and the return operation is stopped. If the point of playing has been returned beyond the desired point, the point of playing is adjusted by fast forward.

Figure 13:
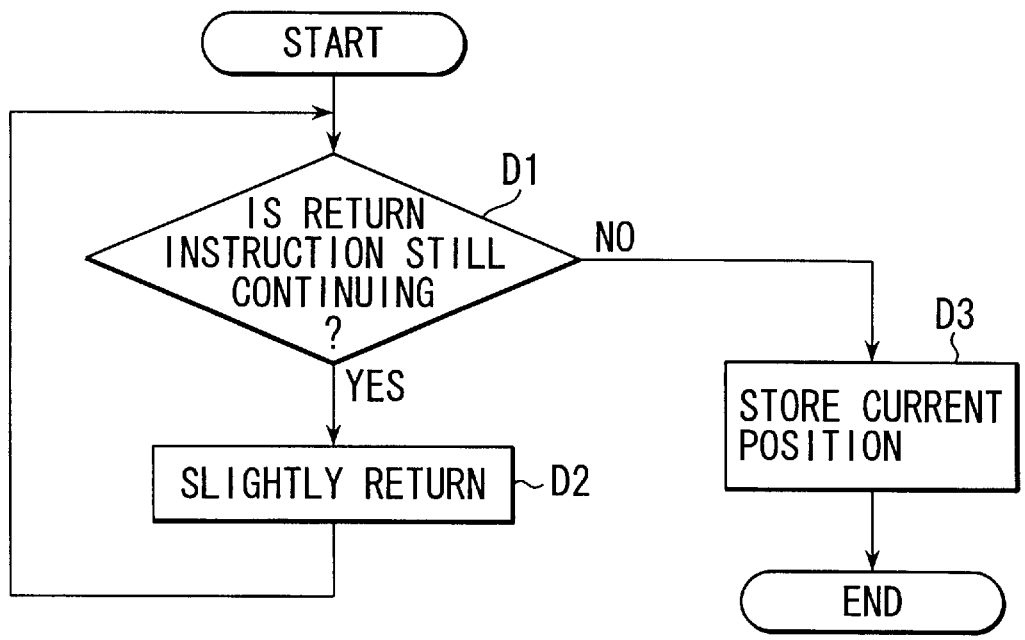
FIG. 13 is a flow chart illustrating a return process in the embodiment.

If the return of the position of playing is instructed by the operation of the first jog switch 3, as described above, the return/fast-forward device 61 executes a return process according to a flow chart of FIG. 13. Specifically, the return/fast-forward device 61 determines whether the return instruction (or fast-forward instruction) is still continuing (step D1). If the return instruction is continuing, the return process (or fast-forward process) is executed (step D2) and control is returned to step D1. Then, steps D1 and D2 are repeated and the return process is executed as long as the return instruction is continuing. If it is determined in step D1 that the return instruction is stopped, the final point of return is stored in the final point storage device 62.

Figure 14:
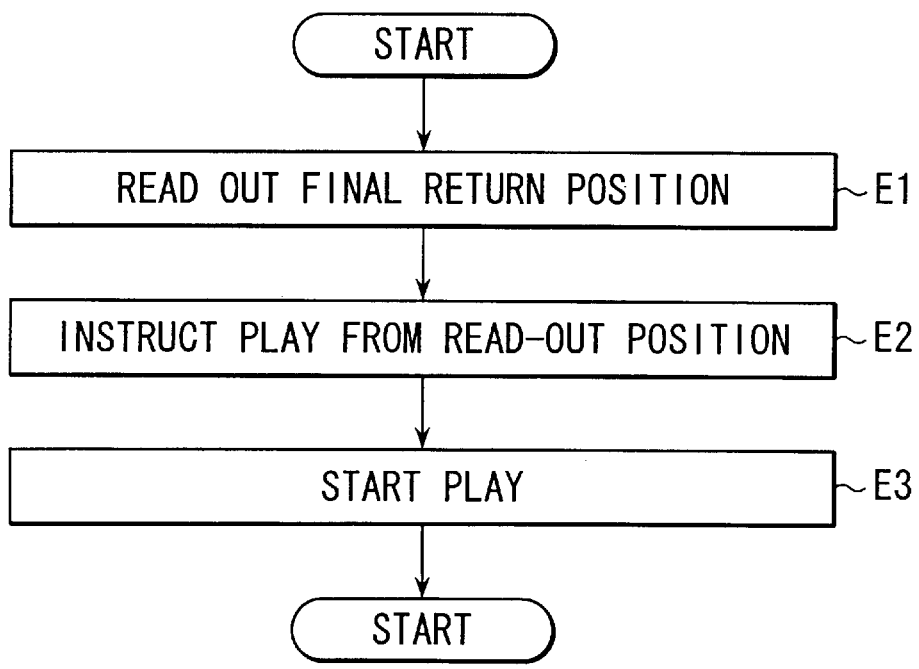
FIG. 14 is a flow chart illustrating a repeated reproducing operation according to a return instruction in the embodiment.

If the playing operation is instructed in the above state, play is started from the stored final point. If the first jog switch 3 is moved upward during playing and the return is instructed, the return instruct device 63 detects the return instruction and executes the quick return process illustrated in FIG. 14.

Specifically, if the return instruct device 63 has detected the return instruction, it reads out the data on the final point of return from the final point storage device 62 (step E1) and outputs it to the position-of-play instruct device 64. Upon receiving the return instruction from the return instruct device 63, the position-of-play instruct device 64 instructs the audio data reproduction device 65 to start play from the final point stored in the final point storage device 62 (step E2). The audio data reproduction device 65 starts play from the position of play as instructed by the position-of-play instruct device 64.

Only by advancing or returning the position of play to a desired start point from which repeat play should begin, is the start point automatically stored in the final point storage device 62. Then, if the one-touch operation is performed, the position of play is exactly returned to the designated point each time to start play. The repeat play is utilized not only for playing of tunes, but also for learning of foreign languages, etc.

[Combinatorial Processing of Skip Function and Quick Return Function]

Figure 15:
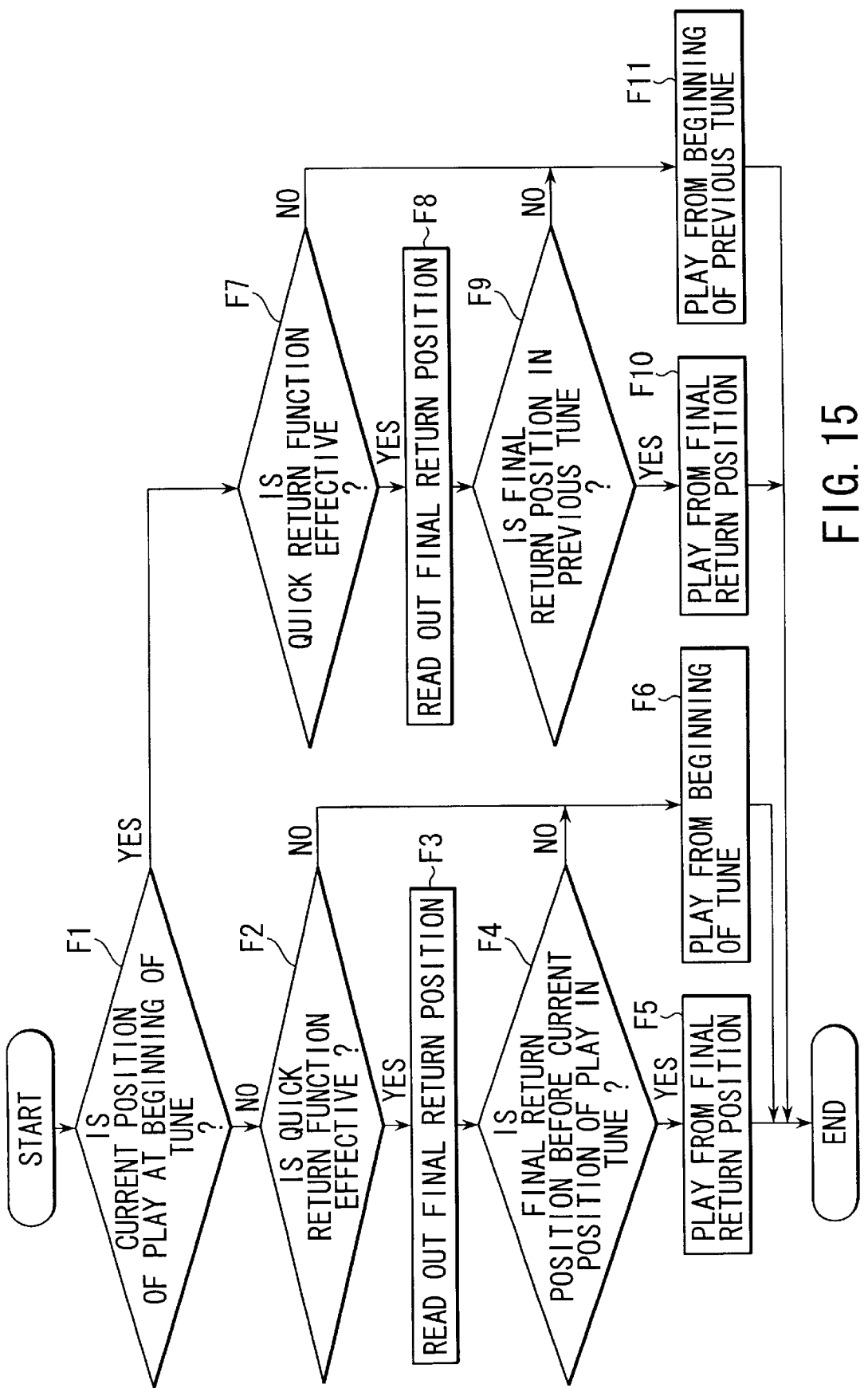
FIG. 15 is a flow chart illustrating a backward skip process in a case where a skip function and a quick return function are performed at a time by the same operation in the embodiment.

Referring now to a flow chart of FIG. 15, a description will be given of a skip process in a case where a reproducing apparatus having a skip function of skipping a data track (tune) forwardly or backwardly performs the skip function and the quick return function shown in FIG. 11 by the same operation. In FIG. 15, it is assumed that skipping is performed backward in the order of playing in respect of the direction of advancing of play.

Figure 16A:
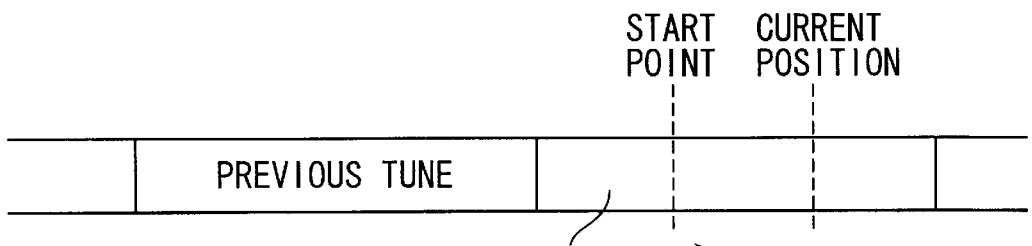
FIGS. 16A to 16D illustrate a reproducing operation in FIG. 15.

If the skip operation (return operation) is performed by the first jog switch 3 during the reproducing operation, it is determined whether the current position of play is at the beginning of a tune or not (step F1). If the current position is not at the beginning of the tune, it is then determined whether the quick return function is effective or not (step F2). If the quick return function is effective, the final point data is taken out of the final point storage device 62 shown in FIG. 11 (step F3) and it is determined whether the final point of return is before or after the current position of play in the tune (step F4). If the final point of return is before the current position of play in the tune, as shown in FIG. 16A, the position-of-play instruct device 64 instructs the audio data reproduction device 65 to start play from the final point (step F5).

Figure 16B:
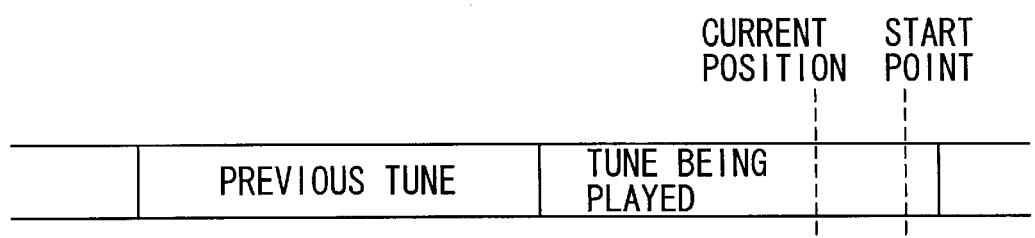

If it is determined in step F2 that the quick return is not effective, or if it is determined in step F4 that the final point of return is not before the current position of play in the tune, i.e. in the state shown in FIG. 16B, the position-of-play instruct device 64 instructs the audio data reproduction device 65 to start play from the beginning of the tune.

Figure 16C:
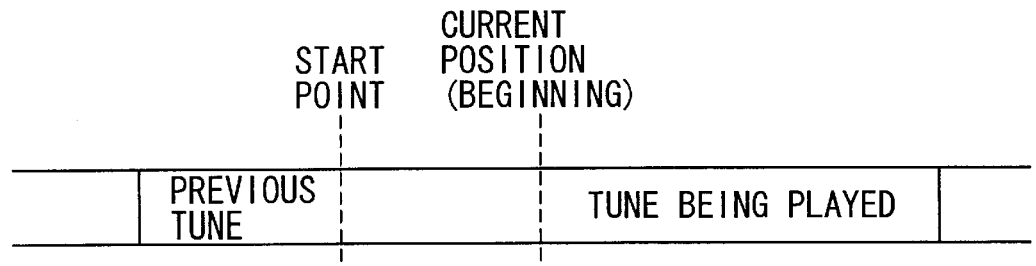

If it is determined in step F1 that the current position of play is at the beginning of the tune, it is then determined whether the quick return function is effective or not (step F7). If the quick return function is effective, the final point data is taken out of the final point storage device 62 (step F8) and it is determined whether the final point of return is in the previous tune (step F9). If the final point return is in the previous tune, as shown in FIG. 16C, the position-of-play instruct device 64 instructs the audio data reproduction device 65 to start play from the final point (step F10).

Figure 16D:
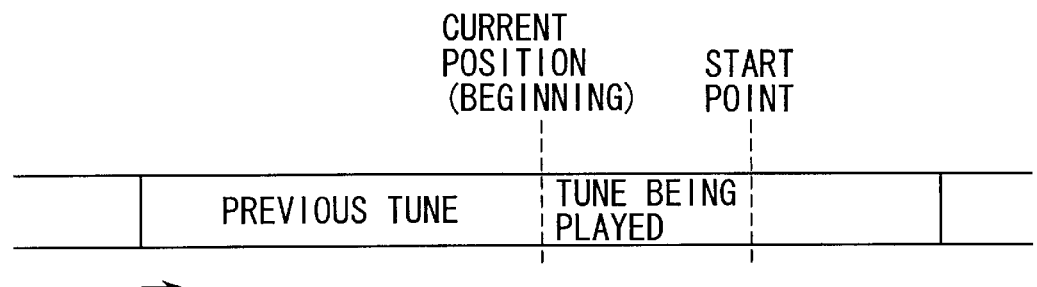

If it is determined in step F7 that the quick return function is not effective, or if it is determined in step F9 that the final point of return is not in the previous tune, the position-of-play instruct device 64 instructs the audio data reproduction device 65 to start play from the beginning of the previous tune, as shown in FIG. 16D (step F11).

As has been described above, the final point of return determined by the return operation is stored in the final point storage device 62 as the start point for repeat play. The stored data is read out from the final point storage device 62 by the next return operation to instruct the position of play by the audio data reproduction device 65. Accordingly, when repeat play of the same audio data is desired, if the return operation is once performed, play can be exactly performed from the desired point in the following operations only by instructing the return operation.

The start point of the portion for repeat play may also be designated by fast forward. If the current position of play is excessively returned beyond the desired point in the first return operation, the position of play is adjusted by the fast forward. In this case, too, play can be exactly performed from the desired point by the return instruction.

Where the skip function of skipping the data track (tune) forwardly or backwardly and the quick return function are performed in combination by the same operation, the point of play stored in the final point storage device 62 is treated as a boundary of tracks at the skipping. Thus, where the number of operation keys is small, the skip instruct key and the return instruct key may be shared and play can be performed from the desired point.

Since the quick return function can be freely turned on/off, the skip function may preferentially be performed.

[Power Supply Process in Power Supply Section]

Figure 17:
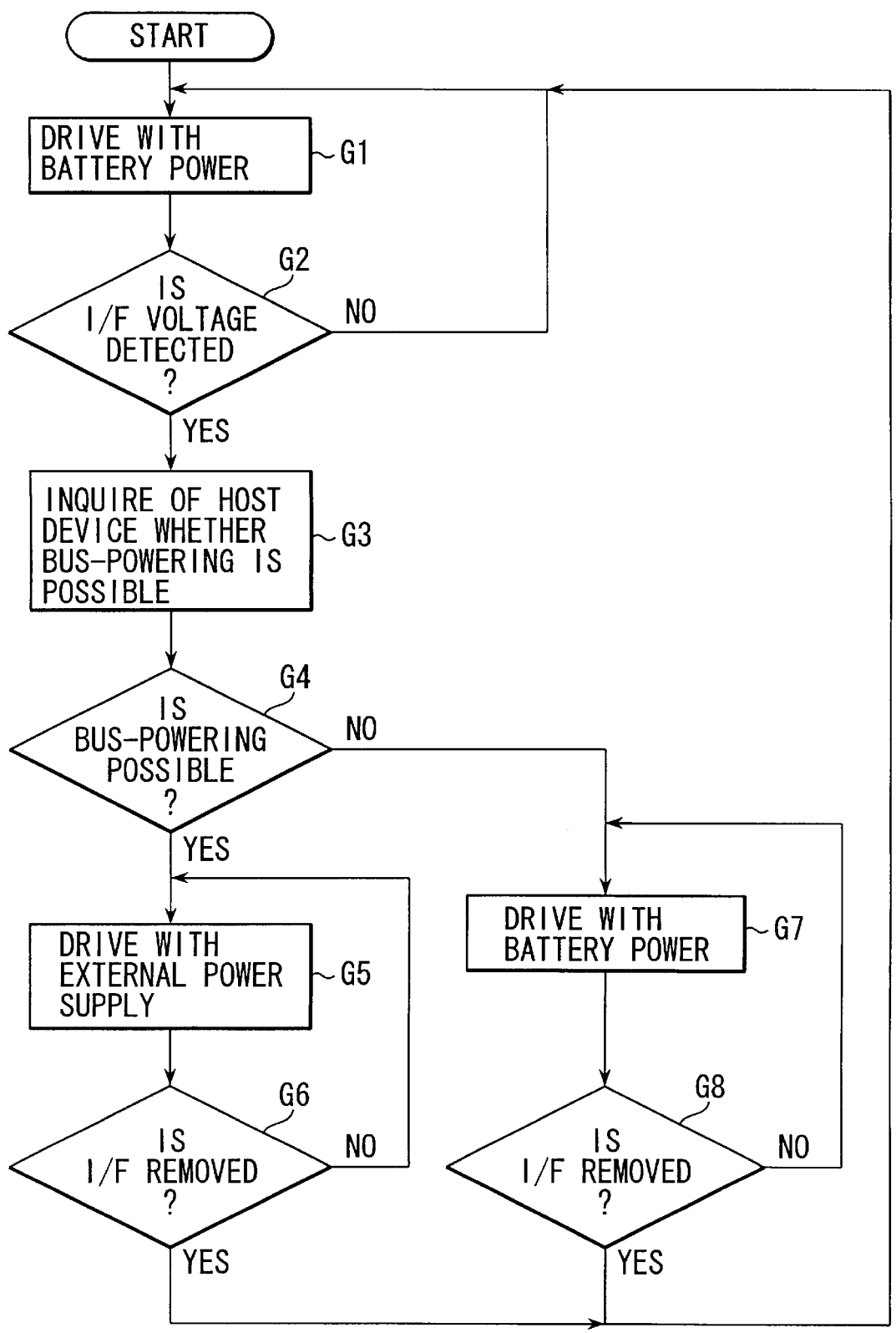
FIG. 17 is a flow chart illustrating a reproducing operation in FIG. 15.

The operation of the power supply section 31 shown in FIGS. 3 and 4 will now be described with reference to a flow chart of FIG. 17. In the normal state in the power supply section 31, the voltage generating circuit 41 generates a DC voltage of 3.0V on the basis of the voltage from the battery 32 and supplies it to the respective circuit components. In addition, the I/F voltage detection circuit 47 detects the presence/absence of power supply from a personal computer (steps G1 and G2). If no power is supplied from the PC, the power voltage supply based on the battery 32 is continued.

If the PC (host device) is connected to the I/F terminal 6 and the I/F voltage detection circuit 47 detects the power from the PC (step G2), the detection signal is delivered to the central control section 23. The central control section 23 inquires of the PC side whether the power supply from the PC may be used for the reproducing apparatus, that is, whether bus-powering is possible, and the central control section 23 determines the result (steps G3 and G4). If bus-powering is possible, an operation instruction is delivered to the voltage generating circuit 42.

Upon receiving the operation instruction from the central control section 23, the voltage generating circuit 42 generates a DC voltage of 3.3V on the basis of the external power supply from the PC. The voltage generating circuit 42 outputs the DC voltage as operational voltage to the respective circuit components via the diode 44 (step G5). Since the voltage of 3.3V generated by the voltage generating circuit 42 is higher than the voltage of 3.0V generated by the voltage generating circuit 41 on the basis on the battery voltage, the voltage generated by the voltage generating circuit 42 is supplied as operational voltage to the respective circuit components. At this time, the I/F voltage detection circuit 47 detects whether the power from the PC is still being supplied (step G6). If the power is supplied from the PC, the voltage generating circuit 42 continues to generate the operational voltage based on the power from the PC and to supply it to the respective circuit components. If the USB, for example, is disconnected from the I/F terminal 6 and the power from the PC is cut off, the cut-off of power is detected by the I/F voltage detection circuit 47 and told to the central control section 23. Then, the power supply mode is restored to the battery power mode in step G1.

If it is determined in step G4 that the bus-powering from the PC is not possible, the respective circuit components are powered by the battery 32 (step G7). At the same time, the I/F voltage detection circuit 47 determines whether the power from the PC is still being supplied (step G8). If the power is supplied, the battery-powered operation in step G7 is continued. If it is determined in step G8 that the power from the PC is cut off, the power supply mode is restored to the battery power mode in step G1.

When the reproducing apparatus is connected to the PC, as described above, the power from the PC is utilized to generate operational voltage to the respective circuit components. Thus, the consumption of power in the battery 32 is saved and the lifetime of the battery is increased. When the power supply voltage is generated based on the battery 32, the central control section 23 monitors the battery voltage (residual power) by means of the battery voltage detection circuit 46. If the battery residual capacity is small, write access to the memory storing programs is prohibited, thereby preventing occurrence of errors.

The above embodiment is directed to the reproduction of audio data. However, the invention is similarly applicable to the case where video data recorded on the memory medium, e.g. in the MPEG2 format is reproduced.

As has been described above in detail, according to the present invention, the reproducing apparatus which reads out and reproduces the digital data compressed and stored in the memory medium includes the means for discriminating playlists of plural kinds of formats and displaying the discriminated playlists on the display section. Even if the memory medium contains playlists of different formats, the playlists are discriminated and the data can be reproduced according to the formats. Therefore, when a removable medium storing audio data or video data is played by some other player, there is no need to form a new playlist and the data can be played according to an expected play order.

In the present invention, playlists detected by the playlist detection means are successively displayed on the display section and a given one of the displayed playlists can be freely chosen. Even if the memory medium contains playlists of different formats or even if plural memory media are mounted, given playlists may be selected for playing.

The apparatus of this invention includes the means for detecting playlists of plural kinds of formats and also detecting data not associated with playlists. When data not associated with playlists is detected, a list of such data is processed as one playlist. Thus, the data prepared for reproducing apparatuses with no playlists can be exactly reproduced.

In the present invention, if the current position of play is returned or fast-forwarded during data reproduction, the final point of return or fast-forwarded is stored in the final point storage means. When a return instruction is issued, the final point is read out of the final point storage means and play is performed from the final point. Accordingly, when repeat play of the same audio data is desired, if the return operation is once performed, play can be exactly performed from the desired point in the following operations only by instructing the return operation.

According to the present invention, in the reproducing apparatus with the skip function, when the skip instruction is issued, it is determined whether the current position of play is at the beginning of the track or not. In addition, the final point of return stored in the final point storage means is compared with the current position of play. Based on the comparison result, the position of play is determined. Thus, where the number of operation keys is small, even if the return instruct means is not provided, it should suffice if the return operation is once performed. In the next operations, play can be exactly performed from the beginning of the track or the desired point only by instructing the skip operation.

Furthermore, in the present invention, in the reproducing apparatus to which a host device is connected via a bus having a current supply function, the connection state of the host device is determined. If the host device is connected, the power from the host device is utilized. Thus, where the host device is connected to the reproducing apparatus, the power from the PC is utilized to save the power consumption of the battery provided on the reproducing apparatus and the lifetime of the battery can be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A reproducing apparatus comprising:

means for returning a position of a start of reproduction;

means for stopping the return of the position of the start of reproduction by the means for returning;

means for obtaining a final point of return when the means for stopping stops the return of the position of the start of reproduction by the means for returning;

means for storing the final point of the return obtained by the means for obtaining;

means for instructing a repeat reproduction operation; and means for reproducing data from the final point of the return when the means for instructing instructs the repeat reproduction operation.

2. A reproducing apparatus comprising:

means for fast-advancing a position of a start of reproduction;

means for stopping the fast-advancing of the position of the start of reproduction by the means for fast-advancing;

means for obtaining a final point of fast-advancing where the means for stopping stops the fast-advancing of the position of the start of reproduction by the means for fast-advancing;

means for storing the final point of the fast-advancing obtained by the means for obtaining;

means for instructing a repeat reproduction operation; and means for reproducing data from the final point of the fast-advancing when the means for instructing instructs the repeat reproduction operation.

3. A reproducing method for reproducing digital data stored in a memory medium, comprising:

returning a position of a start of reproduction;

stopping the return of the position of the start of reproduction;

obtaining a final point of return after the return of the position of the start of reproduction stops;

storing the final point of the return obtained; and reproducing data from the final point of the return when a repeat reproduction operation is instructed.

4. A reproducing method for reproducing digital data stored in a memory medium, comprising:

fast-advancing a position of a start of reproduction;

stopping the fast-advancing of the position of the start of reproduction;

obtaining a final point of fast-advancing after the fast-advancing of the position of the start of reproduction stops;

storing the final point of the fast-advancing obtained; and reproducing data from the final point of the fast-advancing when a repeat reproduction operation is instructed.

* * * * *